(12) United States Patent
Heard

(10) Patent No.: US 7,359,214 B2
(45) Date of Patent: Apr. 15, 2008

(54) BACKPLANE WITH ROUTING TO REDUCE LAYER COUNT

(75) Inventor: Christopher S. Heard, Brookline, NH (US)

(73) Assignee: Amphenol Corporation, Wallingford, CT (US)

( * ) Notice: Subject to any disclaimer, the term of this patent is extended or adjusted under 35 U.S.C. 154(b) by 227 days.

(21) Appl. No.: 10/952,103

(22) Filed: Sep. 28, 2004

(65) Prior Publication Data

US 2006/0067067 A1    Mar. 30, 2006

(51) Int. Cl.
*H01R 12/16*    (2006.01)

(52) U.S. Cl. .................. 361/788; 361/796; 439/796; 370/395.31

(58) Field of Classification Search ............... 439/796; 361/788; 370/395.31
See application file for complete search history.

(56) References Cited

U.S. PATENT DOCUMENTS

| | | | |
|---|---|---|---|
| 5,352,123 A * | 10/1994 | Sample et al. ............. | 439/61 |
| 5,397,861 A * | 3/1995 | Urquhart, II .............. | 174/250 |
| 5,806,178 A | 9/1998 | Bell et al. | |
| 5,982,634 A * | 11/1999 | Wronski .................... | 361/788 |
| 6,015,300 A * | 1/2000 | Schmidt et al. ............ | 439/61 |
| 6,392,160 B1 * | 5/2002 | Andry et al. .............. | 174/261 |
| 6,409,543 B1 | 6/2002 | Astbury, Jr. et al. | |
| 6,423,909 B1 * | 7/2002 | Haynie et al. ............. | 174/261 |
| 6,496,376 B1 * | 12/2002 | Plunkett et al. ........... | 361/729 |
| 6,506,076 B2 | 1/2003 | Cohen et al. | |
| 6,554,647 B1 | 4/2003 | Cohen et al. | |
| 6,592,381 B2 | 7/2003 | Cohen et al. | |
| 6,602,095 B2 | 8/2003 | Astbury, Jr. et al. | |
| 7,124,502 B2 * | 10/2006 | Goergen .................... | 29/851 |
| 2002/0160743 A1 * | 10/2002 | Vianna et al. ............. | 455/349 |
| 2003/0179741 A1 * | 9/2003 | Goergen .................... | 370/351 |

* cited by examiner

*Primary Examiner*—Tuan T. Dinh
*Assistant Examiner*—Hoa C Nguyen
(74) *Attorney, Agent, or Firm*—Blank Rome LLP

(57) ABSTRACT

An electronic system having a backplane designed for efficient routing of signal traces. The system includes two or more daughter cards that are connected to multiple other daughter cards in the system. These daughter cards are mounted centrally to the backplane in the system. Connections between those two daughter cards and the backplane are made through electrical connectors that are distributed in columns along the length of the daughter cards. The connectors are positioned with space between the connectors. The space forms routing channels such that signals that must be connected to the central cards from a daughter cards on either side may be routed through the routing channels.

28 Claims, 6 Drawing Sheets

BACKPLANE WITH ROUTING TO REDUCE LAYER COUNT

BACKGROUND OF INVENTION

1. Field of Invention

This application relates generally to electronic assemblies and more particularly to printed circuit boards used in electronic assemblies.

2. Discussion of Related Art

Electronic systems are often manufactured using multiple printed circuit boards called "daughter cards." Each daughter card contains electronic circuitry. To assemble the system, the daughter cards are installed in a card cage or other mechanical support structure. Often, electrical connectors are mounted on the daughter cards to allow the circuitry on each daughter card to connect to circuitry in other parts of the electronic system. An example of a connector that is used on daughter cards is shown in U.S. Pat. No. 6,554,647 assigned to Amphenol Corporation. The assignee of that patent sells a connector under the name of GbX®.

In a backplane-daughter card configuration, the electronic system includes a printed circuit board called a "backplane." The backplane has connectors on it that mate with the connectors on each of the daughter cards. Conductive paths within the backplane interconnect the connectors on the backplane so that electrical signals may be routed from one daughter card to another.

In a complex electronic system, many signals may be interconnected through the backplane. Signal paths within printed circuit boards are created on conductive traces that are laid out in layers. Backplanes with more connections than can fit on one layer have multiple layers of conductive traces. It is not unusual for a backplane to have 10 layers or more, called "routing layers," containing signal traces.

It is desirable for a printed circuit board to have as few layers as possible. Boards with more layers cost more to manufacture. Having more layers can also increase the thickness of the board, which may undesirably increase the size of the system. Each layer of signal traces is separated from the next layer of signal traces by a ground plane to reduce interference between signals and all layers are separated by insulative material to avoid shorting the conductors on adjacent layers. Accordingly, adding one layer of signal traces increases the thickness of the board by more than the thickness of the signal traces.

Further, having a thicker board with interconnections between layers degrades the integrity of signals transmitted on the board. To make a connection between a connector mounted to a board and a signal trace within the board, a hole is drilled through the board and plated with metal to make a "via" to the signal trace. The connector is attached to the via near the surface of the board. The area where the attachment is made is called the "signal launch." Various forms of signal launches are known. For example, a pad electronically connected to the plating in the via may be used as a signal launch for surface mount connectors. Other connectors have press fit contact tails. Press fit contact tails have compliant portions that may be forced into the vias. Regardless of the specific construction of the signal launch, the amount of distortion introduced by a via is often related to the thickness of the board.

In some circumstances, it is possible to limit the thickness of a printed circuit board by making the signal traces thinner or closer together so that fewer routing layers are required. There are, however, practical limits to the size and spacing of signal traces. If the traces are too close together, signals on one trace may interfere with signals on another trace, creating a form of distortion called "cross talk."

In addition, narrow traces can increase the risk that the circuit board will be manufactured with a defect that shorts two traces together or creates an open circuit. Additionally, as the trace width decreases, the trace becomes more lossy, which can further decrease the integrity of signals transmitted through the backplane. While the negative effects of narrow traces can, to some extent, be overcome, techniques to avoid these problems add manufacturing cost or complexity. For example, tighter controls in the manufacturing process can be used to reduce the chance of defects. The board may also be made with an insulative material that is less lossy than the FR4 or similar material traditionally used to make printed circuit boards. However, special manufacturing materials or processes add cost.

The need to reduce the number of routing layers is particularly important in electronic systems such as routers and switches in which many signals are passed between daughter cards. Thick backplanes are often needed to route the required number of signals.

A particularly challenging configuration is called the "star routed" configuration. In the star routed configuration, a plurality of I/O cards are connected to cards in the center of the backplane, called "switch cards." A particularly challenging routing configuration occurs in systems that use a redundant switch. The redundant switch contains I/O cards that each interface to several lines from outside the switch. Each of the I/O cards is connected to a switch card. The switch card can connect any signal from any I/O card to any I/O card so that signals may pass from any input to the switch to any output of the switch. The switch card and the I/O card are positioned as daughter cards. The connections between these cards is provided through a backplane.

The need to connect so many signals to the switch card requires many routing layers in the backplane. In a redundant switch, the number of signals that must pass through the backplane is even greater. A redundant switch includes a second switch card. Signals from each I/O card are also connected to the second switch card, which can perform all the operations of the first switch card, if the first switch card fails. Accordingly, the number of signals that must pass through the backplane of a redundant switch is double that of an ordinary switch.

It would be desirable to construct a backplane requiring a small number of routing layers for a redundant switch or other electronic systems with a large number of interconnections.

SUMMARY OF INVENTION

In one aspect, the invention relates to a backplane comprising a side region with a first plurality of signal launches positioned in a first plurality of groups. The signal launches in each of the first plurality of groups are positioned for interconnection to at least one electrical connector. The backplane also includes a central region adjacent the side region having a second plurality of signal launches positioned in a second plurality of groups. The signal launches in each of the second plurality of groups are positioned for interconnection to at least one electrical connector, with each of the groups of the second plurality of signal launches disposed in at least a first column and a second column. In addition, the backplane has a plurality of groups of signal traces, each having a first end and a second end. For each group of signal traces, the first ends of the traces in the group are connected to a signal launch in a group in the first plurality of groups. or a first portion of the traces in the group, the second ends of the traces are connected to signal launches in a group in the first column. For a second portion of the traces in the group, the traces are routed between groups of signal launches in the first column and the second ends of the traces are connected to signal launches in a group in the second column.

In another aspect, the invention relates to a backplane that has a first plurality of groups of backplane connector modules, including at least a first central group and a second central group. Each group is disposed in a column, with the columns being parallel. Each connector module has a plurality of contact tails and the connector modules are positioned to leave spaces between modules in each column. The backplane includes a second plurality of groups of backplane connector modules, each group disposed in a column parallel to the columns of the first plurality of groups. The columns are on a first side of the first central group and the second central group. The backplane has a third plurality of groups of backplane connector modules, with each group disposed in a column. The columns are parallel to the columns of the first plurality of groups The columns are on a second side of the first central group and the second central group. A first plurality of groups of signal traces connects contact tails of a first module in each of the second plurality of groups to contact tails of a module in the first central group. A second plurality of groups of signal traces connects contact tails of a second module in each of the second plurality of groups to contact tails of a module in the second central group. Each group of signal traces in the second plurality of groups passes through a space between adjacent connector modules in the first central group. A third plurality of groups of signal traces connects contact tails of a first module in each of the third plurality of groups to contact tails of a module in the second central group. A fourth plurality of groups of signal traces connects contact tails of a second module in each of the third plurality of groups to contact tails of a module in the first central group. Each group of signal traces in the fourth plurality of groups passes through a space between adjacent connector modules in the second central group.

In yet another aspect, the invention relates to a method of designing a backplane for an electronic system having a plurality of first type daughter cards, each having a plurality of connections to at least two second type daughter cards. Each first type daughter card is connected to the backplane at a point that is nearer to the connection point for one of the second type daughter cards than to the connection point for another of the second type daughter cards. The method involves generating a schematic for the backplane; generating a netlist from the schematic; back annotating the schematic to direct traces carrying signals from a daughter card to a further one of the second type daughter cards to pass in groups through routing channels between connectors for attaching to a nearer one of the second type daughter cards; and re-generating the netlist from the back annotated netlist.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
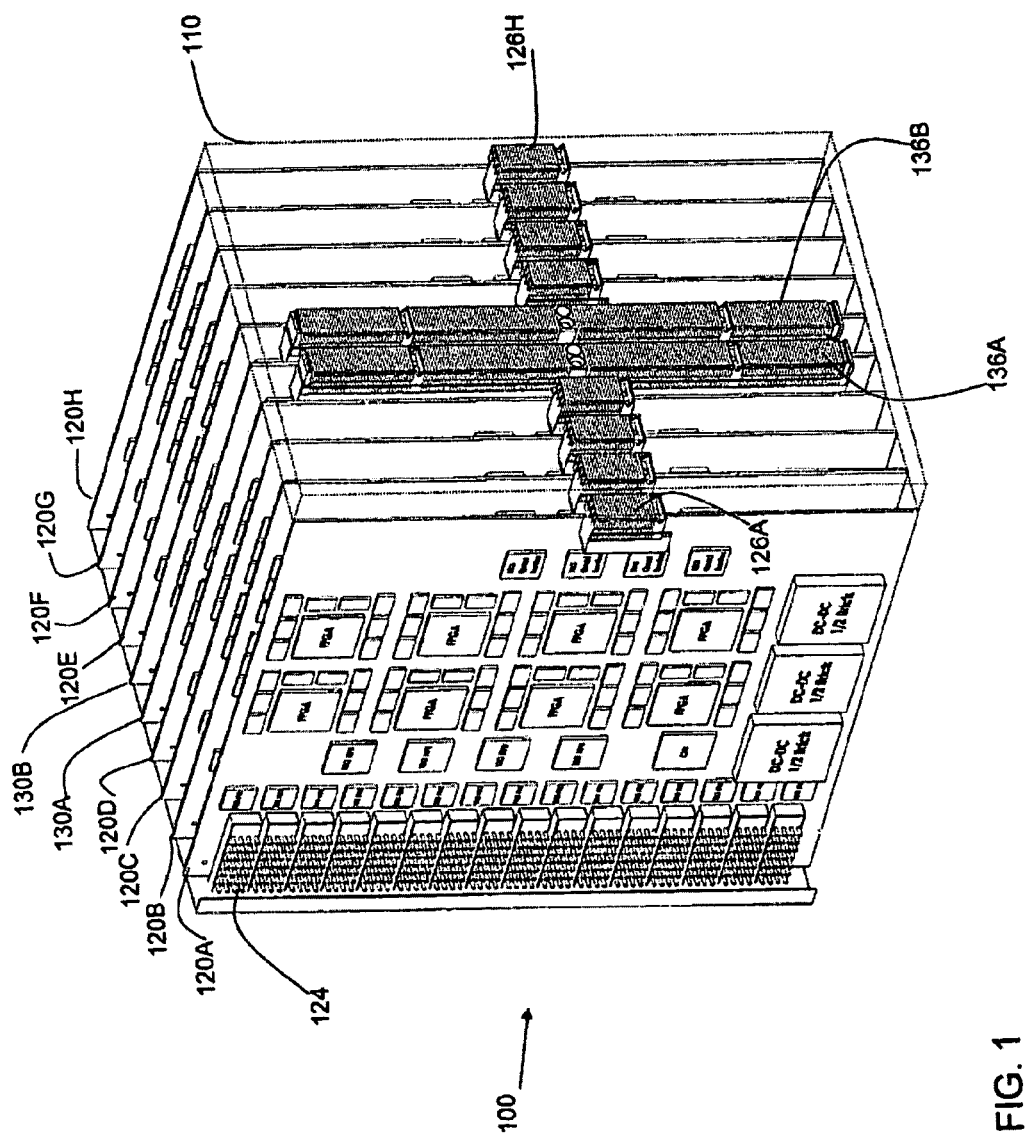
FIG. 1 is a sketch of a redundant switch.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 is a sketch of an electronic system, here illustrated as switch 100. In the described embodiment, switch 100 is a redundant switch.

Switch 100 includes a backplane 110 (shown in phantom). Daughter cards are inserted into connectors on backplane 110. In FIG. 1, two types of daughter cards are shown. One type of daughter card is an I/O card such as 120A, 120B . . . 120H. Each of the I/O cards include one or more I/O connectors 124. Each I/O connector 124 allows external lines to be connected to switch 100. In a contemplated embodiment, signals connected through I/O connector 124 are high speed digital signals such as may be used on a computer network. However, the specific type or application of the signals that pass through connector 124 is not critical to the invention. Preferably, each I/O connector 124 allows multiple external signals to be connected to each I/O card.

Switch 100 also includes a switch card, such as switch card 130A. Switch card 130A includes circuitry that can connect any input signal line to any output signal line.

Signals to be processed by switch 100 enter the system through one of the I/O connectors 124. The signals are initially processed by the I/O card 120A . . . 120H on which the I/O connector 124 is mounted. The signals are then passed through backplane 110 to switch card 130A. Switch card 130A directs the received signal to one of the I/O cards 120A . . . 120H. The signal is then routed back through backplane 110 to the appropriate one of the I/O cards 120A . . . 120H. Upon receiving the signal, circuitry on the I/O card outputs the signal through the appropriate I/O connector. In this way, the signal on any of the input lines may be routed to any of the output lines through switch 100.

In FIG. 1, switch 100 is shown as a redundant switch. In addition to switch card 130A, switch 100 includes a switch card 130B. In this embodiment, switch card 130B is functionally identical to switch card 130A. However, switch card 130B operates only if a malfunction in switch card 130A is detected. Nonetheless, switch card 130B must be connected to each of the I/O cards 120A . . . 120H in the same way that switch card 130A is connected to the I/O cards.

As in a conventional electronic system, signals are routed through backplane 100 using conductive traces on multiple layers in backplane 110. Connections to those traces are made through separable electrical connectors, such as the GbX® connector sold by Amphenol Corporation. GbX® connectors are two-piece electrical connectors with a backplane portion of the connector for mounting to the backplane and a daughter card portion of the connector for mounting to one of the daughter cards.

In the embodiment of FIG. 1, each of the I/O cards 120A . . . 120H has a daughter card connector 126A . . . 126H. Each of the switch cards has a daughter card connector 136A and 136B. Daughter card connectors 136A and 136B are shown to be larger than daughter card connectors 126A . . . 126H to accommodate the larger number of signals routed to each of the switch cards 130A and 130B. GbX® connectors are modular, allowing connectors with the desired number of contacts to be readily provided. The modular connector system also allows flexibility in positioning the modules on the printed circuit board. The modules may be mounted to a support member to form a connector assembly before attachment to the printed circuit board. Accordingly, a collection of connector modules may be regarded as a single connector or as multiple connectors. As used herein, the term "connector" encompasses either possibility unless otherwise indicated. Backplane 110 includes complementary backplane connectors to mate with the daughter card connectors 126A . . . 126H and 136A and 136B.

Figure 2A:
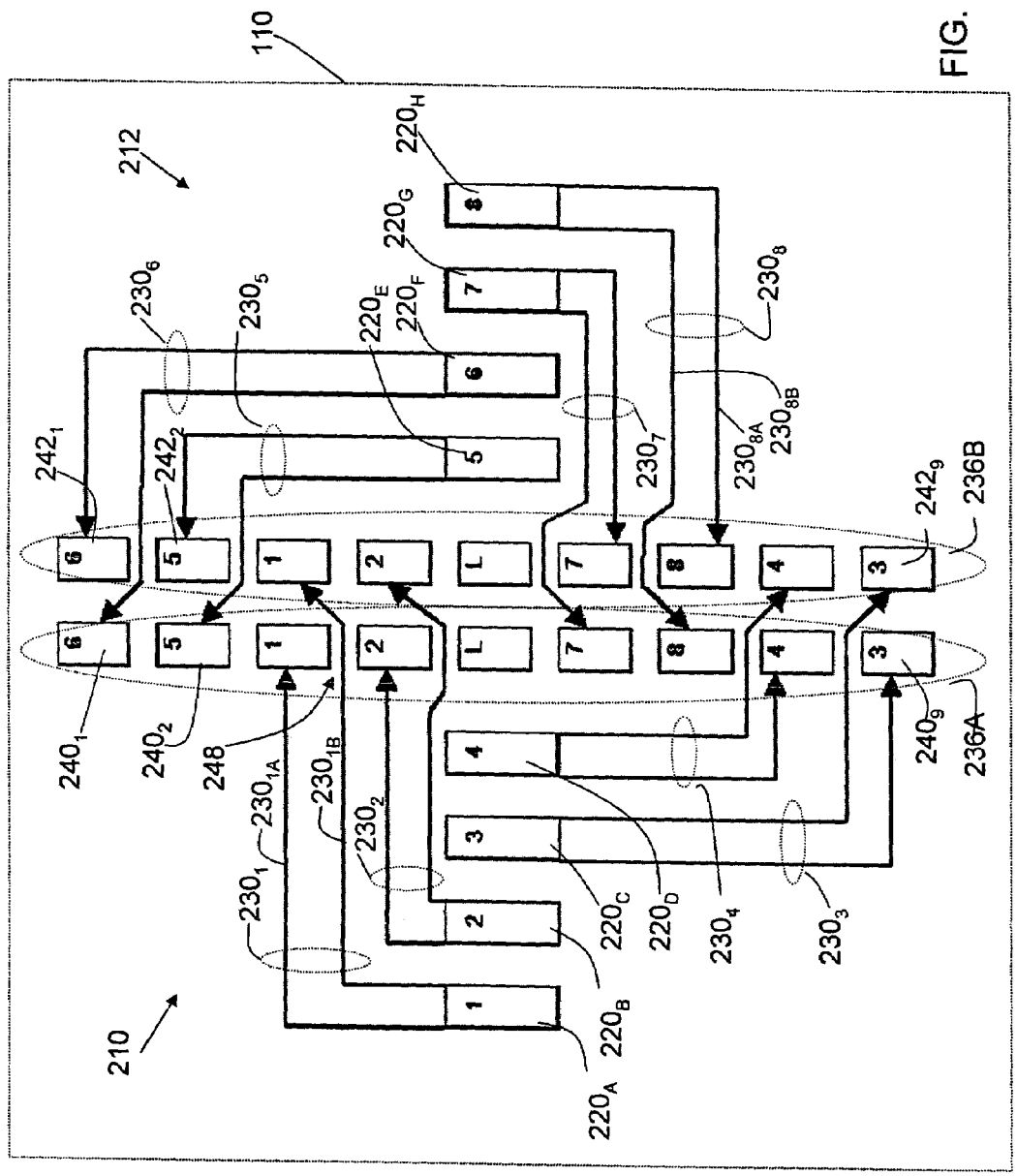
FIG. 2A is a block diagram illustrating interconnections through the backplane of the switch of FIG. 1.

FIG. 2A shows in schematic form the interconnections provided by backplane 110. Backplane 110 is here shown with a left side 210 and a right side 212. Left side 210 includes backplane connectors 220A . . . 220D. Each of the backplane connectors 220A . . . 220D is positioned to mate with a corresponding daughter card connector on one of the I/O cards 120A . . . 120D.

Right side 212 includes a corresponding set of backplane connectors 220E . . . 220H, which are positioned to mate with daughter card connectors on the corresponding I/O cards 120E . . . 120H.

Left side 210 and right side 212 are separated by two columns, 236A and 236B. Each column includes multiple backplane connectors. In FIG. 2A, column 236A is shown to include backplane connectors $240_1$, $240_2$ . . . $240_9$ (of which only $240_1$, $240_2$, and $240_9$ are numbered for simplicity). Column 236B is shown to include backplane connectors $242_1$, $242_2$ . . . $242_9$ (of which only $242_1$, $242_2$, and $242_9$ are numbered for simplicity). The backplane connectors in column 236A are positioned to mate with corresponding daughter card connectors on switch card 130A and the backplane connectors in column 236B are positioned to mate with corresponding daughter card connectors on switch card 130B.

Column 236A and 236B are shown to contain backplane connectors labeled "L." The backplane connectors L represent connectors adapted to carry low speed signals.

As described above, each of the I/O cards 120A . . . 120H is connected to each of the switch cards 130A and 130B. Backplane 110 includes groups of traces $230_1$ . . . $230_8$. Each group of traces $230_1$ . . . $230_8$ connects one of the I/O cards to each of the switch cards 130A and 130B. Accordingly each group of traces $230_1$ . . . $230_8$ includes two portions.

Taking group $230_1$ as illustrative, group $230_1$ has portions $230_{1A}$ and $230_{1B}$. Portion $230_{1A}$ is shown making a connection to a connector in column 236A and portion $230_{1B}$ is shown making connection to a connector in column 236B. Portion $230_{1B}$ must pass through column 236A to reach column 236B. The connectors $240_1$ . . . $240_9$ in column 236A are positioned with routing channels, such as 248, between adjacent connectors. Each routing channel 248 is sized to allow a portion of the group of traces to pass through column 236A.

Each of the other groups of traces $230_2$ . . . $230_4$ on the left side 210 of backplane 110 has similar pattern of traces. Each of the groups includes a portion making connections to a connector in column 236A and a second portion that passes through a routing channel in column 236A to make connection to a connector in column 236B.

Right side 212 has a similar configuration. Backplane connectors 220E . . . 220H are positioned to align with daughter card connectors on I/O cards 120E . . . 120H. Each of the connector locations has associated with it a group of traces $230_5$ . . . $230_8$. Taking group $230_8$ as illustrative, each group contains a first portion such as $230_{8A}$ and a second portion such as $230_{8B}$. Portion $230_{8A}$ is connected to column 236B. Portion $236_{8B}$ passes through column 236B and makes connection to a connector in column 236A.

In this way, connections are provided through backplane 110 to connect each of the I/O cards 120A . . . 120H to each of the switch cards 130A and 130B.

FIG. 2A illustrates each backplane connector 220A . . . 220H as a single unit. However, multiple connectors can be used to make a connection to each of the I/O cards. Because the GbX® connector system is a modular connector system, the connectors illustrated at 220A . . . 220H may be formed from multiple connector modules, depending on the number of signals connected to each of the I/O cards. The connector modules may be mounted with or without spacing between the modules and modules for carrying low speed signals may be used in conjunction with modules carrying high speed signals.

Likewise, the columns of backplane connectors 236A and 236B are each shown to have multiple backplane connectors such as $240_1$ . . . $240_9$. Each connector may be made as a single piece or assembled from multiple connector modules. Where each of the connectors $240_1$ . . . $240_9$ or $242_1$ . . . $242_9$ is made of multiple modules, the modules may be mounted with or without spacing between them. The connector modules in each column 236A and 236B may be tied together into subassembly before being attached to backplane 110.

FIG. 2A depicts backplane 110 in a single plane. In a contemplated embodiment, backplane 110 is formed with multiple layers as in conventional in backplane construction. Each group of traces may include traces on multiple routing layers in the backplane. Preferably, the routing channels 248 between the connectors in columns 236A and 236B accommodate all of the traces in one portion of each group, such as portion $230_{1B}$, with a small number of routing layers in backplane 110. In one contemplated embodiment, backplane 110 will have less than ten routing layers. More preferably, backplane 110 will have five or fewer routing layers. In one contemplated embodiment, backplane 110 has three routing layers.

Figure 2B:
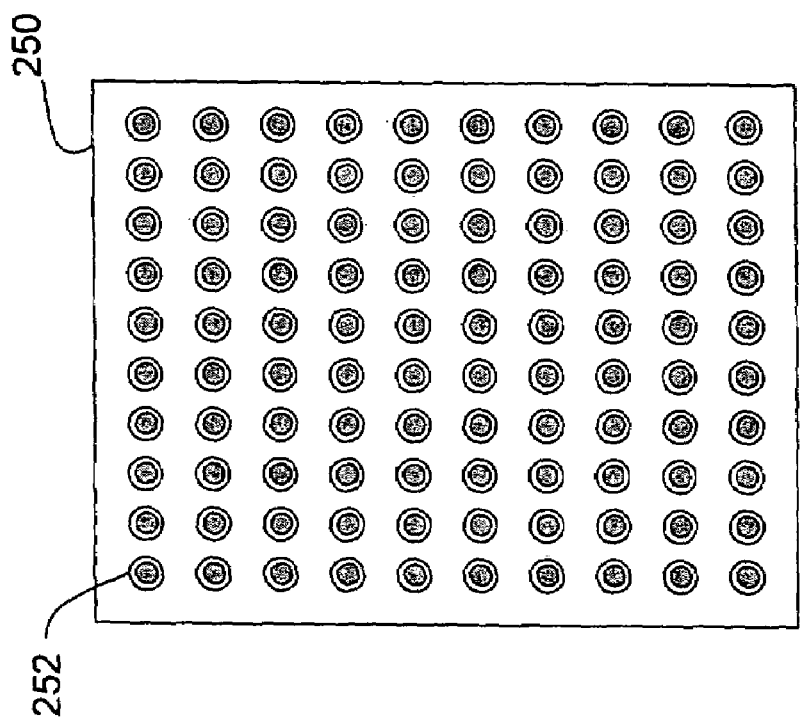
FIG. 2B is a sketch illustrating a connector footprint for a connector in FIG. 2A.

Each connector illustrated in FIG. 2A, such as 220A . . . 220H or $240_1$ . . . $240_9$ or $242_1$ . . . $242_9$, has contact tails that make connection to the traces in backplane 110 through signal launches. FIG. 2B shows a group of signal launches that forms a connector footprint 250. Each signal launch is implemented as a via 252. The via is formed from a hole drilled through a signal trace and then plated with metal. The metal plating makes electrical connection to the trace in backplane 110. A contact tails pressed into the via makes electrical connection to the trace through the conductive plating.

Footprint 250 may represent the footprint of one module of a connector such as the GbX® connector. As described above, each of the connectors on backplane 110 may be made of multiple contiguous modules or modules with spaces in between them. Leaving spaces between modules generally creates an area of the printed circuit board through which signal traces may be routed, such as routing channels 248 (FIG. 2A). In footprint 250, the vias 252 may be spaced to allow traces to be routed between adjacent vias. However, it is generally desired to keep the connectors as compact as possible. Here, the on center spacing between vias is 2 mm or less. In one contemplated embodiment, the spacing is about 1.85 mm. Footprint 250 is pictured to be symmetrical, meaning that the spacing between vias in the row and the column direction is about the same. Though traces can be routed in the space between the vias 252 of footprint 250, that space will likely be occupied by traces connecting to the vias in footprint 250.

Figure 3:
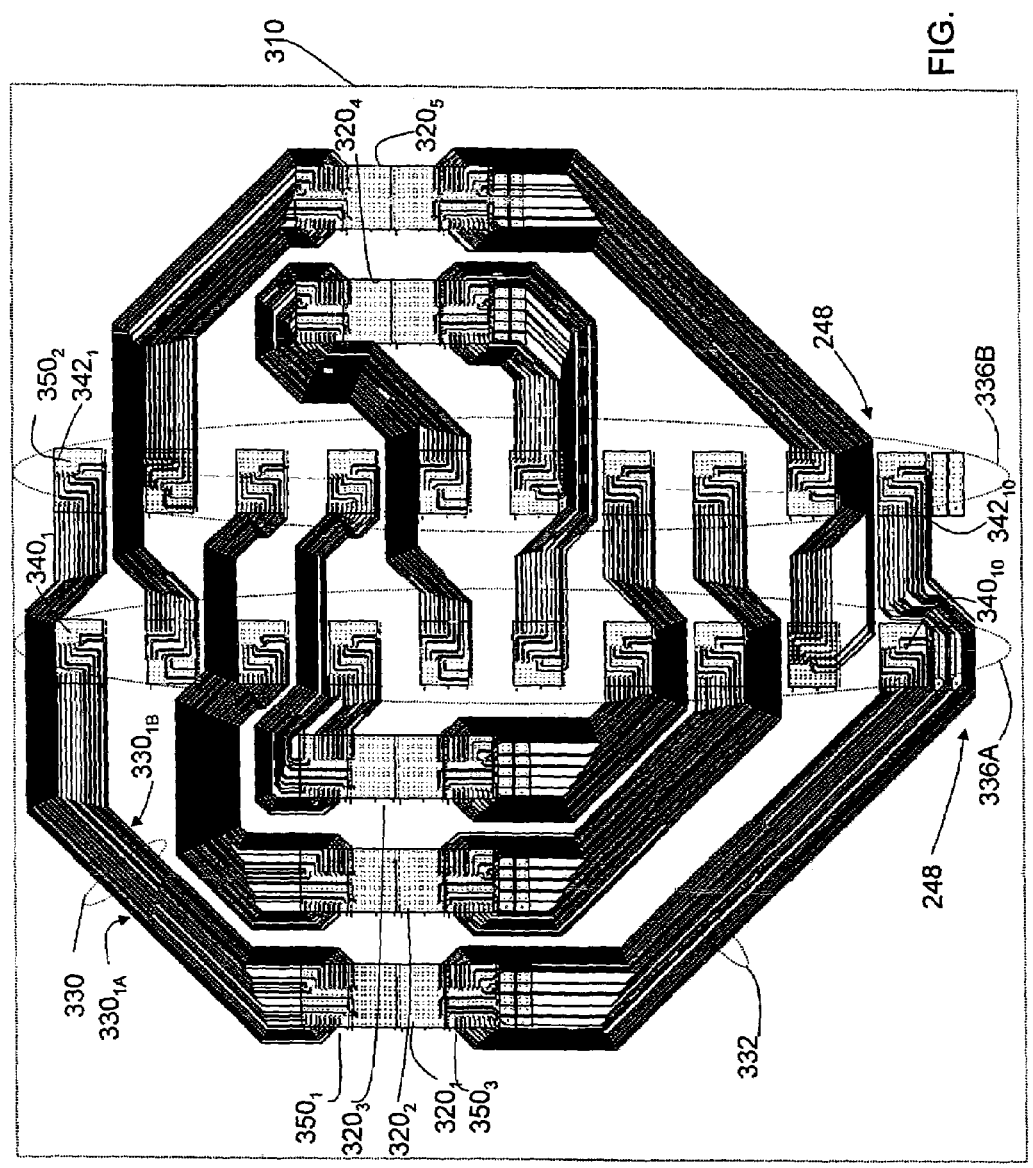
FIG. 3 is a sketch showing routing traces within the backplane of a redundant switch.

FIG. 3 shows the conductive traces inside a backplane 310 such as they might be laid out in an actual implementation of the backplane. Backplane 310 includes connector locations $320_1$, $320_2$, and $320_3$ for backplane connectors to connect with three I/O cards on the left side of backplane 310. Backplane 310 includes connector locations $320_4$ and $320_5$ for backplane connectors to connect to I/O cards on the right side of backplane 310.

Backplane 310 includes a column 336A of connector locations (of which only $340_1$ and $340_{10}$ are numbered for simplicity). Backplane 310 also includes a column 336B of connector locations (of which only $342_1$ and $342_{10}$ are numbered for simplicity). Columns 336A and 336B provide backplane connectors to connect with two switch cards.

Each of the connector locations includes one or more groups of via holes for mounting the connectors. For example, connector location $320_1$ includes multiple groups of vias in the shape of the connector footprint 250 (FIG. 2), of which group $350_1$ is numbered. Each of the connector locations in columns 336A and 336B likewise includes a group of signal launches where a connector may be connected to backplane 310. For example, connector location $342_1$ contains a group $350_2$ of signal launches in the form of footprint 250 (FIG. 2B).

As in FIG. 2A, the connector locations that make up columns 336A and 336B are positioned to leave routing channels 248 between adjacent connector locations.

In the configuration of FIG. 3, each connector location for an I/O card, such as connector location $320_1$ or $320_5$ has two groups of signal traces connected to it. Traces in one group may carry signals from an I/O card to a switch card and traces in the other group may carry signals to the switch card to the I/O card. However, the specific allocation of signals to each trace is not critical. For example, groups 330 and 332 are connected to connector location $320_1$. As illustrated, signal traces in group 330 are connected to vias in a connector footprint $350_1$. Traces in group 332 are connected to vias in a connector footprint $350_3$.

Both groups 330 and 332 have two portions, such as portions $330_{1A}$ and $330_{1B}$. Signal traces in each of the portions such as $330_{1A}$ and $330_{1B}$ are connected to a connector location in either column 336A or 336B. To make a connection to a connector location in the more distant column, the portion is routed through a routing channel in the nearer column, such as routing channel 248. In this way, a relatively large number of connections can be made using a relatively small number of routing layers.

Each column 336A and 336B is laid out to create at least as many routing channels as there are daughter cards connected on the same side of the backplane. For example, two boards are mounted on the same side of the backplane as column 336B. Accordingly, column 336B is laid out with at least two routing channels 248. Preferably, columns 336A and 336B will have the same configuration. Accordingly, the number of routing channels may be defined by the side of the backplane having the most daughter boards connected to it.

Furthermore, the number of routing channels may be influenced by the number of connector modules needed to provide the required number of connections in each column. In FIG. 3, one connector module is used to connect to each portion of a group of traces. With five daughter boards shown, each providing two groups of traces, ten connector modules are used in each column. Preferably, the connector modules are evenly spaced, leaving nine routing channels between connector modules. Additional routing channels may, as pictured in FIG. 3, be available at the ends of each column 336A and 336B.

Figure 4:
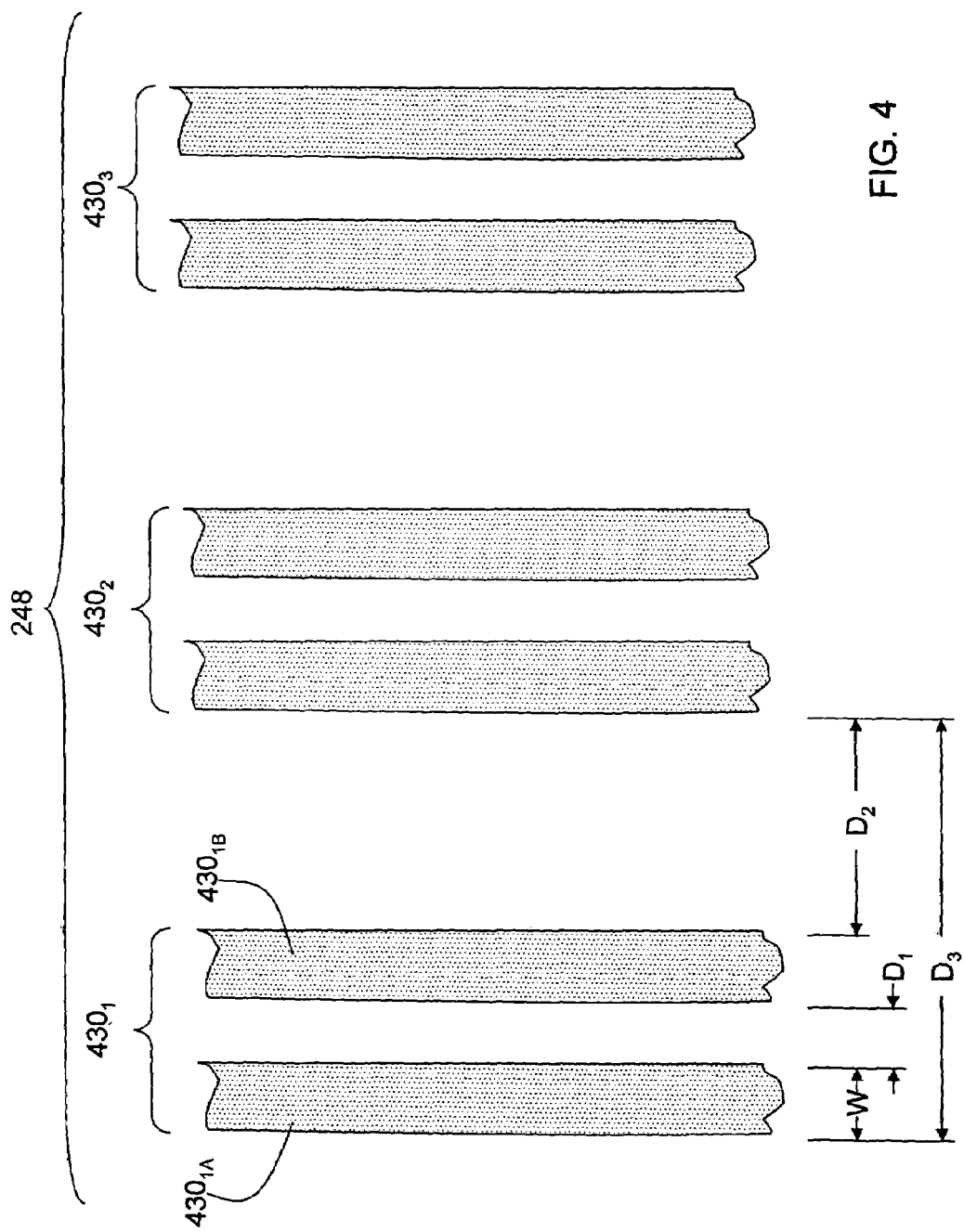
FIG. 4 is a sketch showing an enlarged view of a group of traces of FIG. 3.

FIG. 4 shows in greater detail the construction of a signal traces in routing channel such as 248. FIG. 4 represents one layer of a routing channel. Where a routing channel 248 is implemented on a board having multiple routing layers, the structure of FIG. 4 may be duplicated on each routing layer.

In the illustrated embodiment, switch 100 operates on differential signals. Each signal is carried on a pair of traces such as $430_1$, $430_2$, $430_3$. Taking pair $430_1$ as illustrative, the pair contains signal traces $430_{1A}$ and $430_{1B}$. Each signal trace is formed by metal, such as copper, patterned on a layer of the printed circuit board. Each trace such as $430_{1A}$ has a width W. The traces in the pair such as $430_{1A}$ and $430_{1B}$ are separated by an edge-to-edge distance $D_1$. The pairs such as pair $430_1$ and $430_2$ are separating by an edge-to-edge distance $D_2$. Preferably, the spacings of the traces in the routing channels 248 are selected to provide desirable signal transmission properties. In the described embodiments, the signal traces are designed such that each pair such as $430_1$ presents an impedance between 90Ω and 110Ω, with a preferred impedance of about 100Ω.

It is desirable that a backplane such as 110 or 310 be constructed of conventional printed circuit board materials. Preferably, the backplane such as 110 or 310 is formed from a material having a loss tangent between 0.007 and 0.025. Conventional materials such as FR4 or Nelco 400013-SI can be used. With such a configuration, the width of each trace, W, will be between 6 and 10 mils (0.15 mm and 0.25 mm). The spacing between signal traces, $D_1$ will be between 8 and 12 mils (0.2 mm and 0.3 mm). The spacing between the signal pairs $D_2$ will preferably be between 24 and 32 mils (0.6 mm and 0.79 mm). In one contemplated embodiment, the dimension W is about 8 mils (0.2 mm), the dimension $D_1$ is about 10 mils (0.25 mm) and the dimension $D_2$ is about 28 mils (0.69 mm). The distance $D_3$ is the on center pair to pair spacing. Preferably, the backplane layout should provide routing channels 248 that are sufficiently wide to allow a portion such as $330_{1A}$ or $230_{1B}$ to pass through routing channel 248 without requiring the on center pair to pair spacing to be smaller than 50 mils (1.23 mm).

Figure 5:
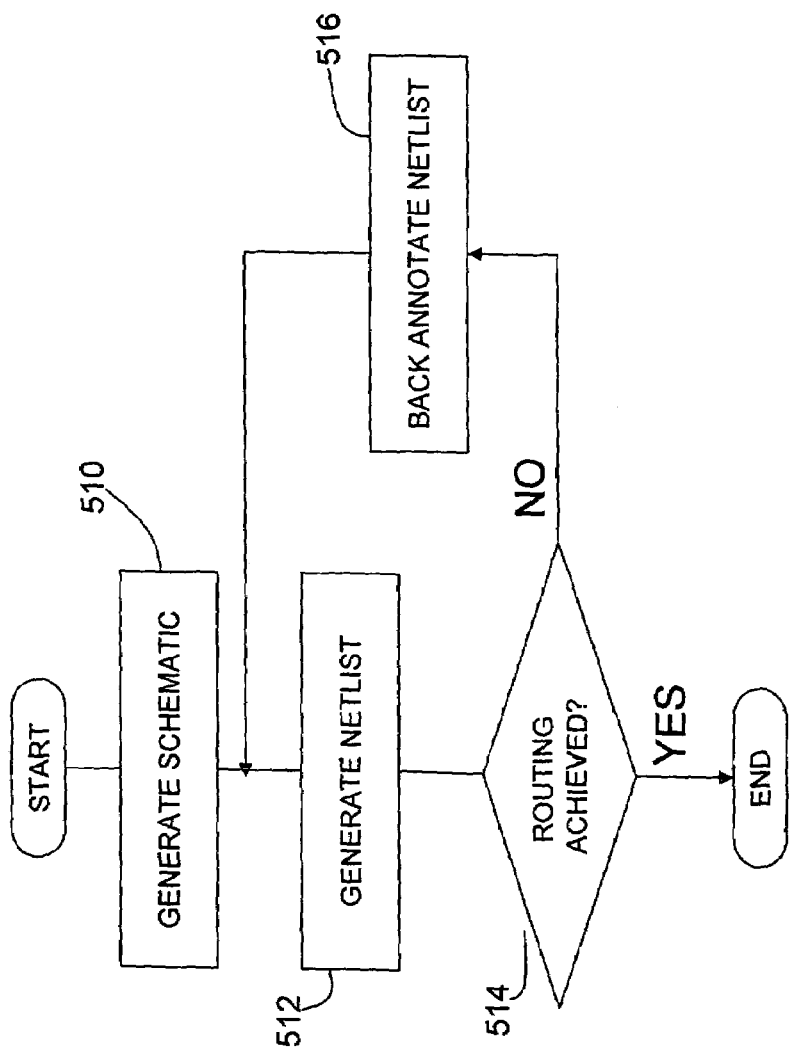
FIG. 5 is a flow chart illustrating design process of the backplane of the system of FIG. 1.

FIG. 5 illustrates a process by which a backplane such as 310 can be designed. The process begins at step 510. At step 510, the backplane is defined in the form of an electrical schematic. The schematic shows the points in system 100 that must be electrically connected together. The schematic shows the connections independent of any physical implementation of the daughter cards or the backplane. Commercially available software such as the Innoveda VIEW DRAW® design tool may be used to generate a schematic.

The process continues at step 512 where the output of the schematic capture tool is used to generate a netlist. The netlist can be generated by a commercially available computer aided design tool such as the Cadence ALLEGRO® design tool. The netlist defines the physical location of routing traces on printed circuit boards to be built according to the schematic.

At step 514, the generated netlist is compared to the desired architecture such as shown in FIG. 2A or 3. The netlist generated by the design tool is examined to determine whether all or substantially all of the signal traces from each connector location that must be routed through one of the columns, such as 236A, 236B, 336A or 336B, passes through a routing channel 248.

Design tools that generate netlists are programmed with general purpose algorithms that are intended to generate an efficient routing of traces on printed circuit boards. However, it is unlikely that a design tool will generate a netlist that is the most efficient for any given circuit design. Accordingly, design tools such as ALLEGRO® include a "back annotation" feature. Back annotation allows a human designer to input instructions to the design tool concerning the routing of specific signals through the printed circuit board. Where the desired routing is not achieved at step 514, the design proceeds to step 516.

At step 516 a human designer back annotates the netlist. The back annotation specifies that traces in a portion of a group such as $330_{1A}$ or $230_{1B}$ be routed together through a specific routing channel 248 between connectors in the columns such as 236A, 236B, 336A or 336B.

The back annotated netlist is then input to the design tool. A new netlist is generated at step 512.

The process again returns to step 514 where the new netlist is checked to determine whether the routing is substantially in the form shown in FIG. 2A or FIG. 3. The process may be repeated in this fashion iteratively until the routing achieves the desired objective.

Having thus described several aspects of at least one embodiment of this invention, it is to be appreciated various alterations, modifications, and improvements will readily occur to those skilled in the art.

For example, as pictured above in FIG. 3, connector locations are formed with connector modules having columns of signal contacts sufficient to provide 4 pairs in each column. Each module has 10 columns. This configuration leads to 40 differential signals per connector module. Thus, each group of signals shown in FIG. 3 contains up to 40 differential signals but other sizes of connectors can be used. For example, the GbX® connector has modules with three or five pairs per column, which can be used.

Other specific values given herein are examples and embodiments may be formed with other values. Connector modules of other sizes may be used.

Such alterations, modifications, and improvements are intended to be part of this disclosure, and are intended to be within the spirit and scope of the invention. Accordingly, the foregoing description and drawings are by way of example only.

What is claimed is:

1. A backplane comprising:
   a first region having a first plurality of signal launches, each of the first plurality of signal launches positioned for interconnection to at least one electrical connector;
   a second region adjacent the first region having a second plurality of signal launches, each of the second plurality of signal launches positioned for interconnection to at least one electrical connector, with each of the second plurality of signal launches disposed in at least a first column and a second column; and
   a plurality of signal traces, each signal trace having a first end and a second end,
   wherein, for each of the plurality of signal traces, the first ends of the traces are connected to signal launches in the first plurality of signal launches, and
   for a first portion of the signal traces, the second ends of the traces are connected to signal launches in the first column; and
   for a second portion of the signal traces, the traces are routed between signal launches in the first column and the second ends of the traces are connected to signal launches in the second column.

2. The backplane of claim 1 having a plurality of connector modules mounted thereto, each connector module interconnected to the signal launches.

3. The backplane of claim 1 wherein the backplane consists of less than 10 routing layers.

4. The backplane of claim 3 wherein the backplane has between 3 and 5 routing layers.

5. The backplane of claim 4 wherein the first column and the second column each comprises at least 800 signal launches.

6. The backplane of claim 1 wherein both the first portion of the traces in each of the plurality of signal traces and the second portion of the traces in each of the plurality of signal traces comprises at least 40 traces.

7. The backplane of claim 6 wherein the traces in both the first portion of the traces in each of the plurality of signal traces and the second portion of the traces in each of the plurality of signal traces are positioned in pairs.

8. The backplane of claim 7 wherein the on-center spacing between adjacent pairs is greater than 1.22 mm.

9. The backplane of claim 1, further comprising: a third region having a third plurality of signal launches, each of the third plurality of signal launches positioned for interconnection to at least one electrical connector.

10. The backplane of claim 9 further comprising:
    a second plurality of signal traces each having a first end and a second end, wherein the first end of each trace is connected to a signal launch in the third plurality of groups wherein,
    for a first portion of the traces, the second ends of the traces are connected to signal launches in a group in the second column; and
    for a second portion of the traces, the traces are routed between signal launches in the second column and the second ends of the traces are connected to signal launches in a group in the first column.

11. An electronic assembly comprising:
    a backplane including,
      a first region having a first plurality of signal launches, each of the first plurality of signal launches positioned for interconnection to at least one electrical connector,
      a second region adjacent the first region having a second plurality of signal launches, each of the second plurality of signal launches positioned for interconnection to at least one electrical connector, with each of the second plurality of signal launches disposed in at least a first column and a second column,
      a third region having a plurality of signal launches, each of the third plurality of signal launches positioned for interconnection to at least one electrical connector, and
      a plurality of signal traces each having a first end and a second end wherein for each of the plurality of signal traces, the first ends of the traces are connected to signal launches in the first plurality of signal launches, and for a first portion of the signal traces, the second ends of the traces are connected to signal launches in the first column, and for a second portion of the signal traces, the traces are routed between signal launches in the first column and the second ends of the traces are connected to signal launches in the second column;

a first plurality of backplane connectors connected to the first plurality of signal launches;

a second plurality of backplane connectors connected to the second plurality of signal launches;

a third plurality of backplane connectors connected to the third plurality of signal launches;

a first plurality of daughter cards having daughter card connectors engaged to the first plurality of backplane connectors;

a second plurality of a daughter cards having daughter card connectors engaged to the second plurality of backplane connectors; and a third plurality daughter cards having daughter card connectors engaged to the third plurality of backplane connectors.

12. The electronic assembly of claim 11 wherein the second plurality of daughter cards engaged to the second plurality of backplane connectors comprise switch cards.

13. The electronic assembly of claim 12 wherein first plurality of daughter cards having daughter card connectors engaged to the first plurality of backplane connectors comprise I/O cards.

14. A backplane comprising:
a first plurality of backplane connector modules disposed in a first column and a second column, with the first and the second columns being parallel, each connector module having a plurality of contact tails;

a second plurality of backplane connector modules disposed in a third column, each connector module having a plurality of contact tails, the third column being parallel to the first column, and the third column being disposed on a first side of the first and the second columns;

a third plurality of backplane connector modules disposed in a fourth column, the fourth column being parallel to the second column, with each connector module having a plurality of contact tails and the columns being disposed on a second side of the first and the second columns;

a first plurality of signal traces, each signal trace connecting contact tails of a module in the third column to contact tails of a module in the first column;

a second plurality of signal traces, each signal trace disposed adjacent to and parallel with the first plurality of signal traces and connecting contact tails of another module in the third column to contact tails of a module in the second column, each signal trace of the second plurality of signal traces passing through a space between adjacent connector modules in the first column;

a third plurality of signal traces, each connecting contact tails of a module in the fourth column to contact tails of a module in the second column; and a fourth plurality of signal traces, each signal trace disposed adjacent to and parallel with the third plurality of signal traces and connecting contact tails of another module in the fourth column to contact tails of a module in the first column, each signal trace of the fourth plurality of signal traces passing through a space between adjacent connector modules in the second column.

15. The backplane of claim 14 wherein the backplane connector modules in the first column have contact tails disposed in a regular rectangular array.

16. The backplane of claim 14 wherein the backplane connector modules in each of the first, second and third columns have contact tails spaced by 2 mm or less on center.

17. The backplane of claim 16 wherein the backplane connector modules in each of the first, second and third columns comprise greater than or equal to 40 pairs.

18. The backplane of claim 16 further comprising a dielectric substrate with the first, second, third and fourth pluralities of signal traces disposed on routing layers formed in the substrate.

19. The backplane of claim 18 comprising ten or fewer routing layers.

20. The backplane of claim 19 wherein the first, second, third and fourth pluralities of signal traces comprise pairs of signal traces, each pair having an impedance between 90 Ω and 110 Ω.

21. The backplane of claim 20 wherein the substrate comprises a material having a loss tangent between 0.007 and 0.025.

22. A backplane comprising:
a first plurality of signal launches disposed in a row;

a second plurality of signal launches disposed in a first column substantially orthogonal to the row of the first plurality of signal launches;

a third plurality of signal launches disposed in a second column substantially parallel to the first column of the second plurality of signal launches;

a first plurality of traces coupling one of the first plurality of signal launches disposed in the row to one of the second plurality of signal launches disposed in the first column, each of the first plurality of traces having end portions and an intermediate portion, the intermediate portions of the first plurality of traces being aligned with one another; and a second plurality of traces coupling another one of the first plurality of signal launches disposed in the row to one of the third plurality of signal launches disposed in the second column, each of the second plurality of traces having end portions and an intermediate portion, the intermediate portions of the second plurality of traces being aligned with one another and with the second plurality of traces.

23. The backplane of claim 22, wherein the first and the second columns are positioned between two of the first plurality of signal launches.

24. The backplane of claim 22, wherein the traces are closely spaced to minimize the distance therebetween.

25. The backplane of claim 22, wherein the signal launches each receive one of the first plurality of traces.

26. The backplane of claim 22, wherein the intermediate portions of the first plurality of traces are parallel to the intermediate portions of the second plurality of traces.

27. The backplane of claim 22, wherein the signal launches of the first column are spaced to allow the second plurality of traces to pass through to the second column.

28. A switch comprising:
a backplane;
a first plurality of daughter card connectors disposed in a row on the backplane;

a second plurality of daughter card connectors disposed in a first column on the backplane substantially orthogonal to the row;

a third plurality of daughter card connectors disposed in a second column on the backplane substantially parallel to the first column;

a first plurality of signal traces, each signal trace coupling one of the first plurality of daughter card connectors disposed in the row with one of the second plurality of daughter card connectors disposed in the first column;

a second plurality of signal traces, each signal trace coupling another one of the first plurality of daughter card connectors disposed in the row with one of the third plurality of daughter card connectors disposed in the second column;

a first daughter card having an edge and a first connector disposed on the edge, the first connector coupled to one of the first plurality of daughter card connectors;

a second daughter card having an edge and a plurality of second connectors disposed on the edge, the plurality of second connectors coupled to the second plurality of daughter card connectors; and a third daughter card having an edge and a plurality of third connectors disposed on the edge, the plurality of third connectors coupled to the third plurality of daughter card connectors, wherein the daughter card connectors of the first column are spaced to allow the second plurality of signal traces to pass through to the second column.

* * * * *